(12) United States Patent
Balasubramaniam (10) Patent No.: US 7,767,926 B2
(45) Date of Patent: Aug. 3, 2010

(54) METHOD AND SYSTEM FOR DRY DEVELOPMENT OF A MULTI-LAYER MASK USING SIDEWALL PASSIVATION AND MASK PASSIVATION

(75) Inventor: Vaidyanathan Balasubramaniam, Woburn, MA (US)

(73) Assignee: Tokyo Electron Limited, Tokyo (JP)

( * ) Notice: Subject to any disclaimer, the term of this patent is extended or adjusted under 35 U.S.C. 154(b) by 1162 days.

(21) Appl. No.: 11/391,672

(22) Filed: Mar. 29, 2006

(65) Prior Publication Data
US 2007/0235424 A1 Oct. 11, 2007

(51) Int. Cl.
*B23K 10/00* (2006.01)
(52) U.S. Cl. .................... 219/121.43; 219/121.59; 219/121.44; 216/67; 204/298.38
(58) Field of Classification Search .............. 219/121.4, 219/121.41, 121.43, 121.44, 121.59; 216/67; 204/298.37, 298.38
See application file for complete search history.

(56) References Cited

U.S. PATENT DOCUMENTS

| 5,728,629 | A | 3/1998 | Mizuno et al. |
| 6,303,270 | B1 | 10/2001 | Flaim et al. |
| 7,344,991 | B2 | 3/2008 | Balasubramaniam et al. |
| 7,465,673 | B2 | 12/2008 | Igarashi et al. |
| 2004/0180269 | A1 | 9/2004 | Balasubramaniam et al. |
| 2005/0106889 | A1 | 5/2005 | Lin et al. |

OTHER PUBLICATIONS

International Preliminary Report on Patentability issued in Application No. PCT/US07/061049 mailed Oct. 9, 2008.
International Search Report issued in counterpart International Application No. PCT/US07/61049, mailed Aug. 1, 2008.
Written Opinion issued in counterpart International Application No. PCT/US07/61049, mailed Aug. 1, 2008.

*Primary Examiner*—Mark H Paschall (57) ABSTRACT

A method and system for the dry development of a multi-layer mask is described. A first passivation gas comprises as an incipient ingredient a hydrocarbon gas, while a second passivation gas comprises as an incipient ingredient an oxygen-containing gas.

10 Claims, 10 Drawing Sheets

METHOD AND SYSTEM FOR DRY DEVELOPMENT OF A MULTI-LAYER MASK USING SIDEWALL PASSIVATION AND MASK PASSIVATION

CROSS REFERENCE TO RELATED APPLICATIONS

The present invention is related to pending U.S. patent application Ser. No. 10/640,577, entitled "METHOD AND APPARATUS FOR MULTILAYER PHOTORESIST DRY DEVELOPMENT" and filed on Aug. 14, 2003, and pending U.S. patent application Ser. No. 10/736,782, entitled "METHOD AND APPARATUS FOR BILAYER PHOTORESIST DRY DEVELOPMENT" and filed on Dec. 17, 2003, the entire contents of which are herein incorporated by reference.

BACKGROUND OF THE INVENTION

1. Field of Invention

The present invention relates to a method and apparatus for plasma processing a substrate, and more particularly to a method for multilayer mask dry development.

2. Description of Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

SUMMARY OF THE INVENTION

The present invention relates to a method and apparatus for plasma processing a substrate, and to a method and apparatus for multilayer photoresist dry development. The present invention also relates to the multilayer mask itself.

According to one embodiment, a method for forming, and a computer readable medium with program instructions to cause a computer system to control a process chamber to form, a multilayer mask for etching material. An organic layer is formed on the material. A light sensitive mask layer is formed on the organic layer. A pattern is formed in the light sensitive mask layer. The pattern in the light sensitive mask layer is transferred to the organic layer by etching the organic layer using a process gas comprising one or more gasses collectively containing nitrogen and hydrogen, a first passivation gas including as an incipient ingredient a hydrocarbon, and a second passivation gas including as an incipient ingredient an oxygen containing gas.

According to another embodiment, a plasma processing system for etching an organic layer on a substrate includes a plasma processing chamber for facilitating the formation of a plasma from a process gas in order to transfer a pattern from a light sensitive mask layer to the organic layer by the etching. A controller is coupled to the plasma processing chamber and is configured to execute a process recipe utilizing the process gas, wherein the process gas comprises one or more gasses collectively containing nitrogen and hydrogen, a first passivation gas including a hydrocarbon, and a second passivation gas including as an incipient ingredient an oxygen containing gas.

According to yet another embodiment, a multilayer mask includes an organic anti-reflective coating (ARC). A light-sensitive layer is disposed on the anti-reflective coating, the light-sensitive layer and the anti-reflective coating defining a feature therethrough. A first passivation layer is disposed on a sidewall of the feature. A second passivation layer is disposed on a portion of the light-sensitive layer.

DETAILED DESCRIPTION OF PREFERRED EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

Figure 1A:
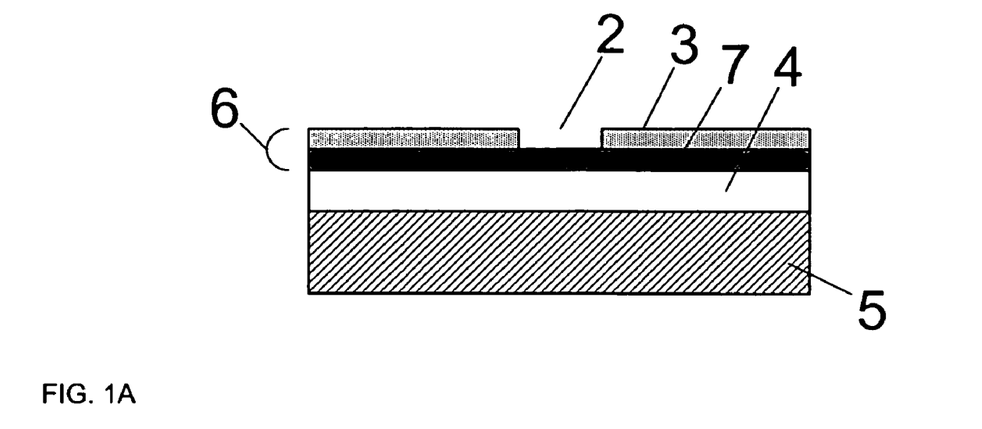
FIGS. 1A, 1B, and 1C show a schematic representation of a typical procedure for pattern etching a thin film.
Figure 1B:
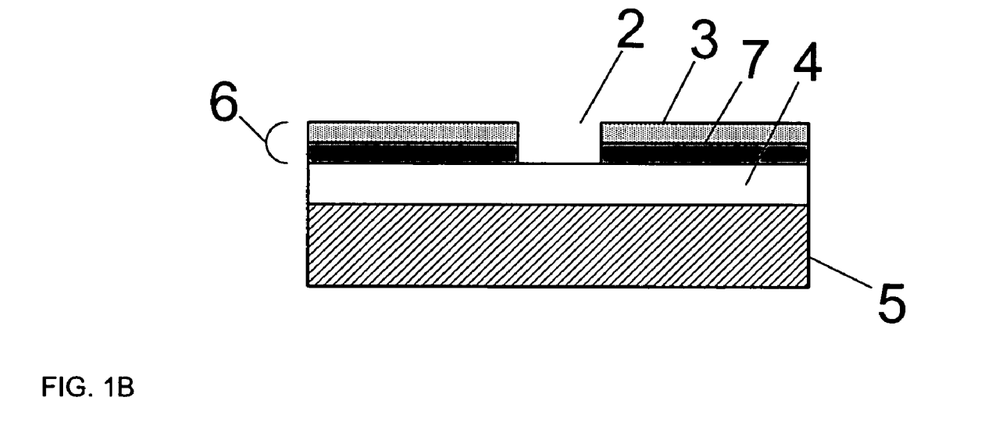
Figure 1C:
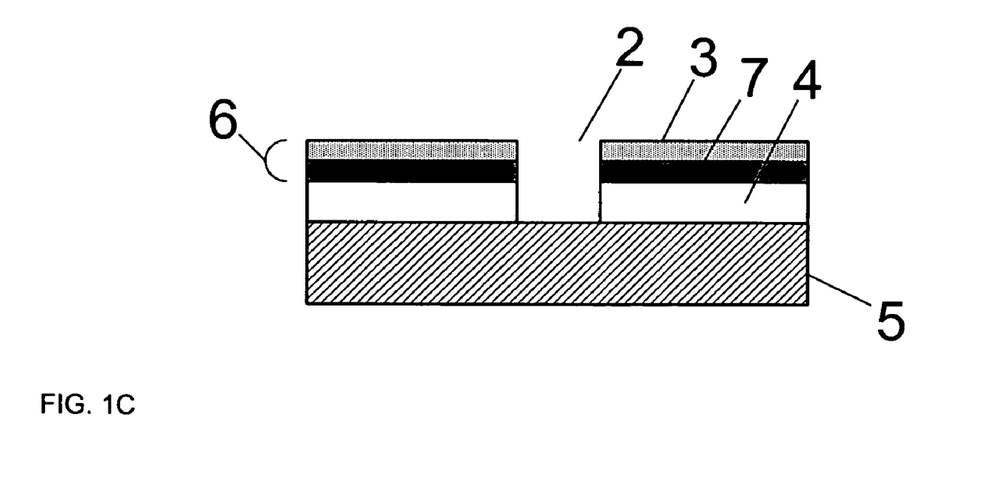

In material processing methodologies, pattern etching comprises the application of a thin layer of light-sensitive material, such as photoresist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photo-resist), or non-irradiated regions (as in the case of negative resist) using a developing solvent. Multi-layer masks can be implemented for etching features in a thin film. For example, as shown in FIGS. 1A-C, a multilayer mask 6 comprising light-sensitive layer 3, such as a silicon-containing light sensitive mask layer, with pattern 2 formed using conventional lithographic techniques and an organic layer 7, such as an organic anti-reflective coating (ARC), can be utilized as a mask for etching a material such as thin film 4 on substrate 5, wherein the mask pattern 2 in the light-sensitive layer 3 is transferred to the organic layer 7 using a separate etch step preceding the main etch step for the thin film 4.

In one embodiment, a process gas for etching organic layer 7 comprises one or more gasses collectively containing nitrogen and hydrogen, a first passivation gas including as an incipient ingredient a hydrocarbon which may facilitate sidewall passivation of the organic layer, and a second passivation gas including as an incipient ingredient an oxygen containing gas which may facilitate passivation of at least a portion of the light-sensitive layer. For example, the process gas comprising one or more gasses collectively containing nitrogen and hydrogen can include as incipient ingredient(s) $N_2$ and $H_2$, or ammonia ($NH_3$), or a combination thereof. Additionally, for example, the first passivation gas can include as an incipient ingredient $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or any combination of two or more thereof. Furthermore, for example, the second passivation gas can include as an incipient ingredient $O_2$, CO, $CO_2$, NO, $NO_2$, or $N_2O$, or a combination of two or more thereof Although the embodiment above describes the etching of thin film 4 on substrate 5, the etching can be of substrate 5 itself, with or without thin film 4, or any other material.

Figure 2:
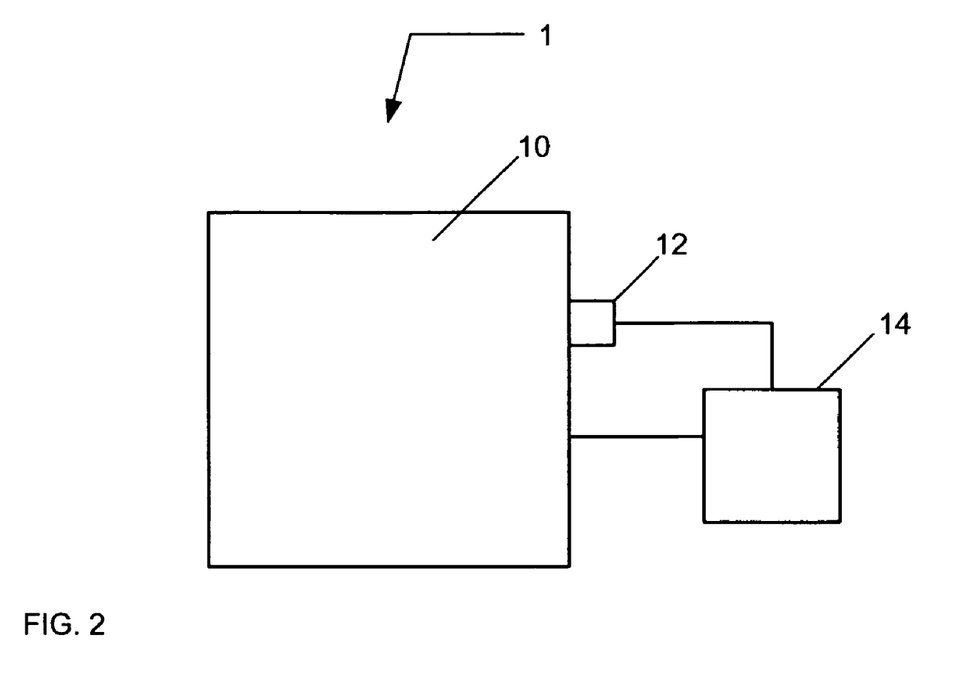
FIG. 2 shows a simplified schematic diagram of a plasma processing system according to an embodiment of the present invention.

According to one embodiment, a plasma processing system 1 is depicted in FIG. 2 comprising a plasma processing chamber 10, a diagnostic system 12 coupled to the plasma processing chamber 10, and a controller 14 coupled to the diagnostic system 12 and the plasma processing chamber 10. The controller 14 is configured to execute a process recipe comprising at least one of the above-identified chemistries to etch an organic layer. Additionally, controller 14 is configured to receive at least one endpoint signal from the diagnostic system 12 and to post-process the at least one endpoint signal in order to accurately determine an endpoint for the process. In the illustrated embodiment, plasma processing system 1, depicted in FIG. 2, utilizes a plasma for material processing. Plasma processing system 1 can comprise an etch chamber.

Figure 3:
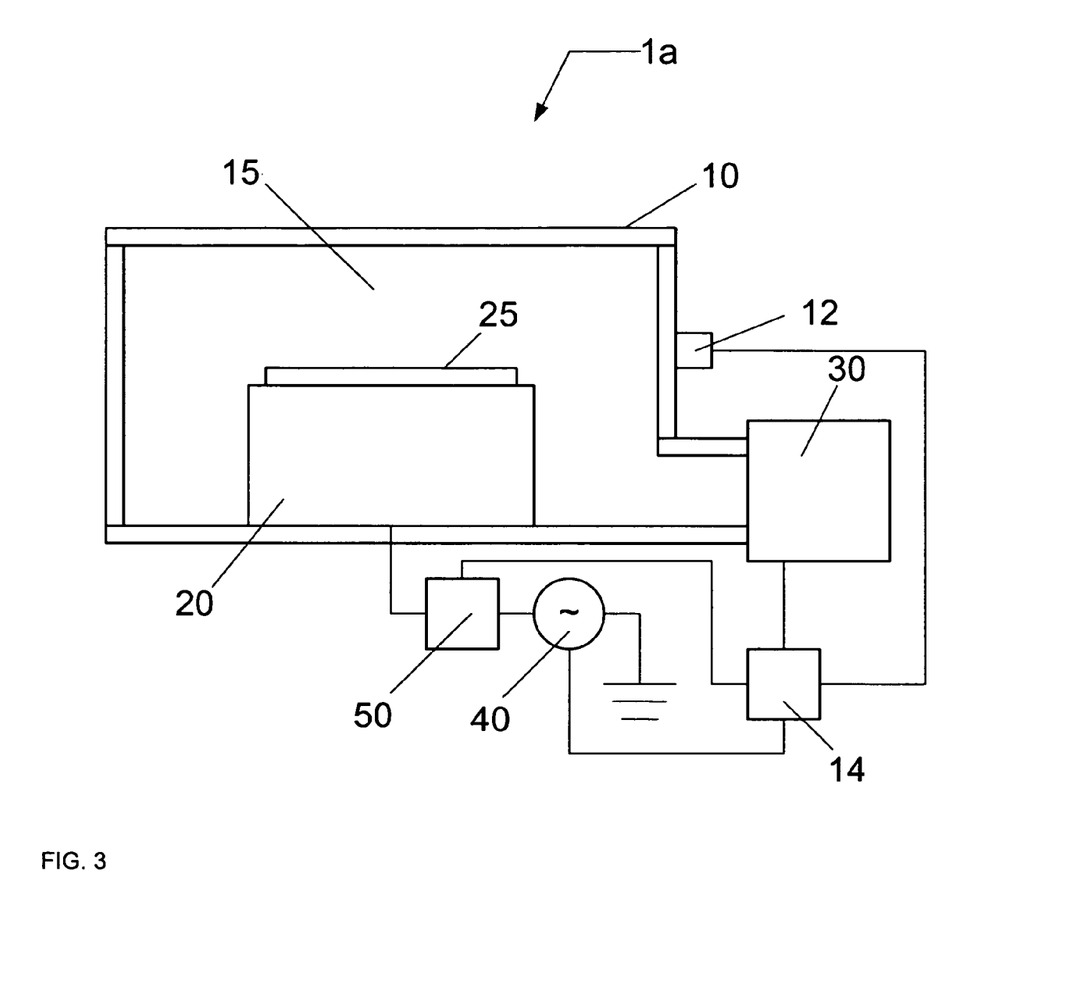
FIG. 3 shows a schematic diagram of a plasma processing system according to another embodiment of the present invention.

According to the embodiment depicted in FIG. 3, plasma processing system 1a can comprise plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 can be affixed to the substrate holder 20 via an electrostatic clamping system. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 25. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 50 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g. L-type, $\pi$-type, T-type, etc.) and automatic control methods are well known to those skilled in the art.

Vacuum pump system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 14 comprises a microprocessor, memory, and a digital I/O port capable of generating control voltages sufficient to communicate and activate inputs to plasma processing system 1a as well as monitor outputs from plasma processing system 1a. Moreover, controller 14 can be coupled to and can exchange information with RF generator 40, impedance match network 50, the gas injection system (not shown), vacuum pump system 30, as well as the backside gas delivery system (not shown), the substrate/substrate holder temperature measurement system (not shown), and/or the electrostatic clamping system (not shown). A program stored in the memory can be utilized to activate the inputs to the aforementioned components of plasma processing system 1a according to a process recipe in order to perform the method of etching an organic ARC layer. One example of controller 14 is a DELL PRECISION WORKSTATION 610™, available from Dell Corporation, Austin, Tex.

Controller 14 may be locally located relative to the plasma processing system 1a, or it may be remotely located relative to the plasma processing system 1a via an internet or intranet. Thus, controller 14 can exchange data with the plasma processing system 1a using at least one of a direct connection, an intranet, or the internet. Controller 14 may be coupled to an intranet at a customer site (i.e., a device maker, etc.), or coupled to an intranet at a vendor site (i.e., an equipment manufacturer). Furthermore, another computer (i.e., controller, server, etc.) can access controller 14 to exchange data via at least one of a direct connection, an intranet, or the internet.

The diagnostic system 12 can include an optical diagnostic subsystem (not shown). The optical diagnostic subsystem can comprise a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include a line CCD (charge coupled device), a CID (charge injection device) array, or a light dispersing device such as a grating or a prism. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337, the contents of which are incorporated herein by reference.

The diagnostic system 12 can include a high resolution Optical Emission Spectroscopy (OES) sensor such as from Peak Sensor Systems, or Verity Instruments, Inc. Such an OES sensor can have a broad spectrum that spans the ultraviolet (UV), visible (VIS), and near infrared (NIR) light spectrums. The resolution can be approximately 1.4 Angstroms, that is, the sensor can be capable of collecting about 5550 wavelengths from about 240 to about 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light passing through an optical vacuum window can be focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

Figure 4:
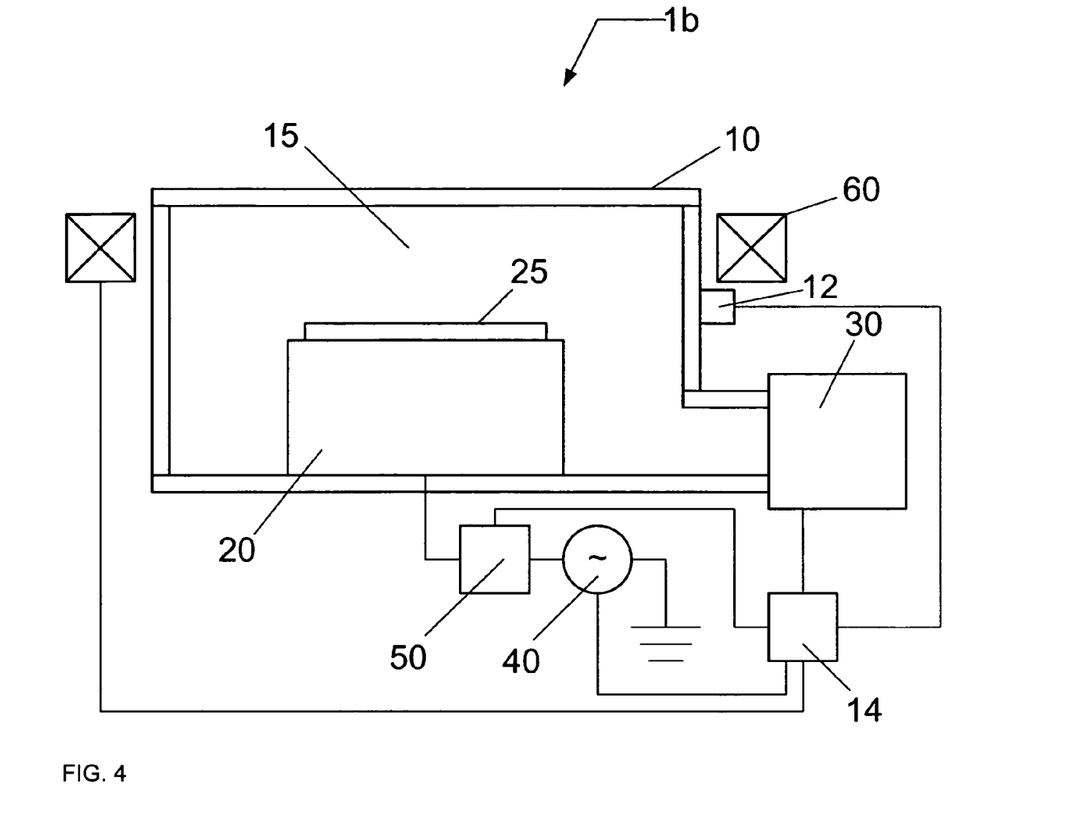
FIG. 4 shows a schematic diagram of a plasma processing system according to another embodiment of the present invention.

In the embodiment shown in FIG. 4, the plasma processing system 1b can be similar to the embodiment of FIG. 2 or 3 and further comprise either a stationary, or mechanically or electrically rotating magnetic field system 60, in order to potentially increase plasma density and/or improve plasma processing uniformity, in addition to those components described with reference to FIG. 2 and FIG. 3. Moreover, controller 14 can be coupled to magnetic field system 60 in order to regulate the speed of rotation and field strength. The design and implementation of a rotating magnetic field is well known to those skilled in the art.

Figure 5:
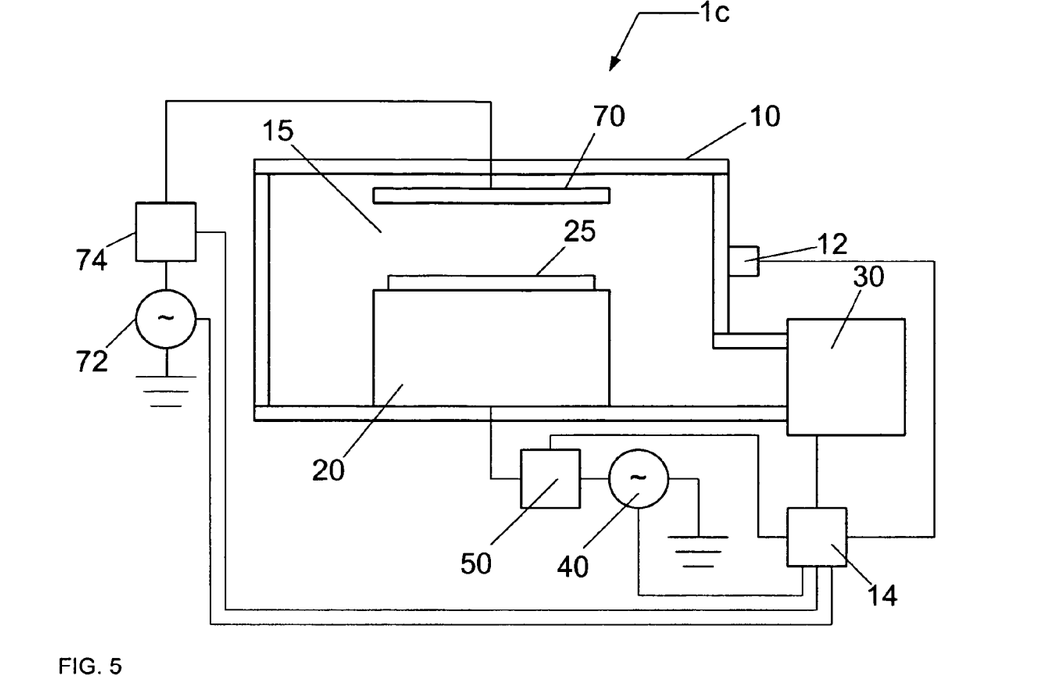
FIG. 5 shows a schematic diagram of a plasma processing system according to another embodiment of the present invention.

In the embodiment shown in FIG. 5, the plasma processing system 1c can be similar to the embodiment of FIG. 2 or FIG. 3, and can further comprise an upper electrode 70 to which RF power can be coupled from RF generator 72 through an optional impedance match network 74. A typical frequency for the application of RF power to the upper electrode can range from about 0.1 MHz to about 200 MHz. Additionally, a typical frequency for the application of power to the lower electrode can range from about 0.1 MHz to about 100 MHz. Moreover, controller 14 is coupled to RF generator 72 and impedance match network 74 in order to control the application of RF power to upper electrode 70. The design and implementation of an upper electrode is well known to those skilled in the art.

Figure 6:
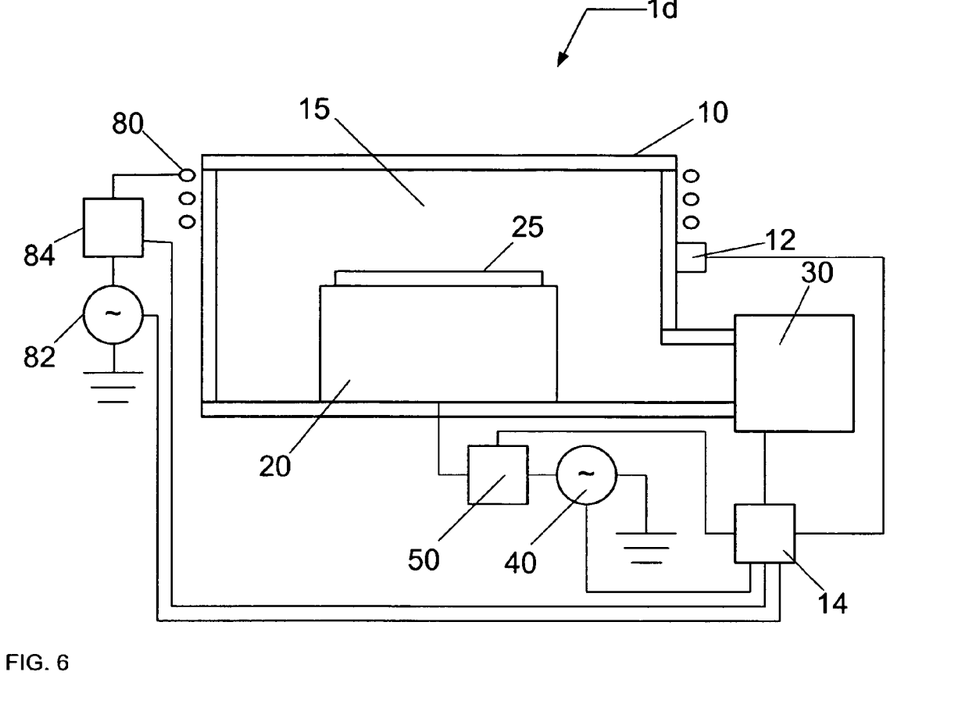
FIG. 6 shows a schematic diagram of a plasma processing system according to another embodiment of the present invention.

In the embodiment shown in FIG. 6, the plasma processing system 1d can, for example, be similar to the embodiments of FIGS. 2 and 3, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the following discussion, a method of etching an organic layer utilizing a plasma processing device is presented. For example, the plasma processing device can comprise various elements, such as described in FIGS. 2 through 6, and combinations thereof.

In an embodiment, the method of etching an organic layer comprises employing as incipient ingredients $NH_3$, a hydrocarbon gas such as $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, $C_6H_{12}$, or the like, or combination thereof, and an oxygen containing gas such as $O_2$, $CO$, $CO_2$, $NO$, $NO_2$, $N_2O$, or the like, or combination thereof. For example, a process parameter space can comprise a chamber pressure of about 20 to about 1000 mTorr, an $NH_3$ process gas flow rate ranging from about 50 to about 1000 sccm, a hydrocarbon process gas flow rate ranging from about 5 to about 100 sccm, an oxygen containing gas flow rate ranging from about 5 to about 100 sccm, an upper electrode (e.g., element 70 in FIG. 5) RF bias ranging from about 500 to about 2000 W, and a lower electrode (e.g., element 20 in FIG. 5) RF bias ranging from about 10 to about 500 W. Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another embodiment, the method of etching an organic layer comprises employing as incipient ingredients $N_2$ and $H_2$, a hydrocarbon gas such as $C_2H_4$, $CH_4$, $C_2H_2$, $C_2H_6$, $C_3H_4$, $C_3H_6$, $C_3H_8$, $C_4H_6$, $C_4H_8$, $C_4H_{10}$ $C_5H_8$, $C_5H_{10}$, $C_6H_6$, $C_6H_{10}$, $C_6H_{12}$, or the like, or any combination thereof and an oxygen containing gas such as $O_2$, CO, $CO_2$, NO, $NO_2$, $N_2O$, or the like, or any combination thereof For example, a process parameter space can comprise a chamber pressure of about 20 to about 1000 mTorr, a $N_2$ process gas flow rate ranging from about 50 to about 1000 sccm, a $H_2$ process gas flow rate ranging from about 50 to about 1000 sccm, a hydrocarbon process gas flow rate ranging from about 5 to about 100 sccm, an oxygen containing gas flow rate ranging from about 5 to about 100 sccm, an upper electrode (e.g., element 70 in FIG. 5) RF bias ranging from about 500 to about 2000 W, and a lower electrode (e.g., element 20 in FIG. 5) RF bias ranging from about 10 to about 500 W. Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In an alternate embodiment, the process chemistry can further comprise an inert gas, such as a noble gas. The inert gas can include helium (He) or argon (Ar). For instance, the introduction of Helium to the process can relieve feature side-wall roughness.

In general, the etch time can be determined using design of experiment (DOE) techniques; however, it can also be determined using endpoint detection. One possible method of endpoint detection is to monitor a portion of the emitted light spectrum from the plasma region that indicates when a change in plasma chemistry occurs due to substantially near completion of the organic layer etching and contact with the underlying material film. For example, portions of the spectrum that indicate such changes comprise wavelengths of 387.2 nm (carbon-nitrogen (CN)), and can be measured using optical emission spectroscopy (OES). After emission levels corresponding to those frequencies cross a specified threshold (e.g., drop to substantially zero or increase above a particular level), an endpoint can be considered to be complete. Other wavelengths that provide endpoint information can also be used. Furthermore, the etch time can be extended to include a period of over-etch, wherein the over-etch period constitutes a fraction (i.e. 1 to 100%) of the time between initiation of the etch process and the time associated with endpoint detection.

Figure 7:
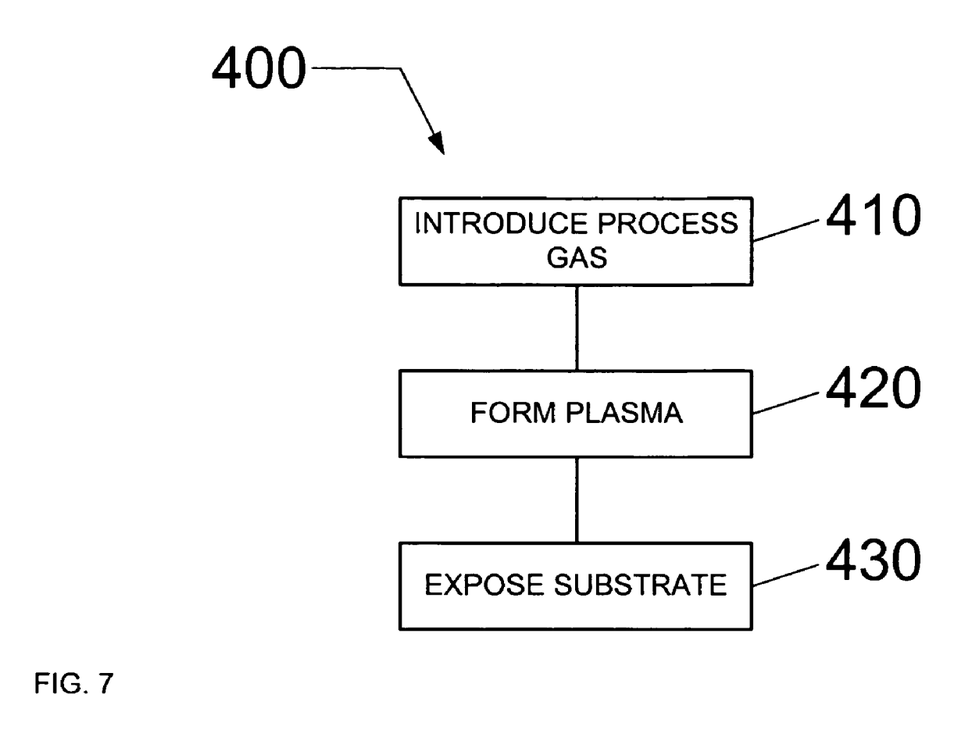
FIG. 7 presents a method of etching an organic layer on a substrate in a plasma processing system according to an embodiment of the present invention.

FIG. 7 presents a flow chart of a method for etching an organic layer, such as an organic anti-reflective coating (ARC), on a substrate in a plasma processing system according to an embodiment of the present invention. Procedure 400 begins at 410 in which a process gas is introduced to the plasma processing system, wherein the a process gas comprises one or more gasses collectively containing nitrogen and hydrogen, a first passivation gas including as an incipient ingredient a hydrocarbon, and a second passivation gas including as an incipient ingredient an oxygen containing gas. For example, the process gas comprising one or more gasses collectively containing nitrogen and hydrogen can include as incipient ingredients $N_2$ and $H_2$, or ammonia ($NH_3$), or a combination thereof. Additionally, for example, the first passivation gas can include as an incipient ingredient $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$ or any combination thereof. Furthermore, for example, the second passivation gas can include as an incipient ingredient $O_2$, CO, $CO_2$, NO, $NO_2$, or $N_2O$, or any combination thereof. Alternately, the process gas can further comprise helium (He).

In 420, a plasma is formed in the plasma processing system from the process gas using, for example, any one of the systems described in FIGS. 2 through 6, or combinations thereof.

In 430, the substrate comprising the organic layer is exposed to the plasma formed in 420. After some time, procedure 400 ends. The time during which the substrate with the organic layer is exposed to the plasma is generally dictated by the time required to etch the organic layer, or the time required to transfer a photoresist pattern to the organic layer. In general, the time required to transfer a photoresist pattern through the thickness of the organic layer is pre-determined. Alternately, the time can be further augmented by a second period of time, or an over-etch time period. As described above, the over-etch time can comprise a fraction of time, such as 1 to 100%, of the first time, and this over-etch period can comprise an extension of etching beyond the detection of endpoint.

Figure 8:
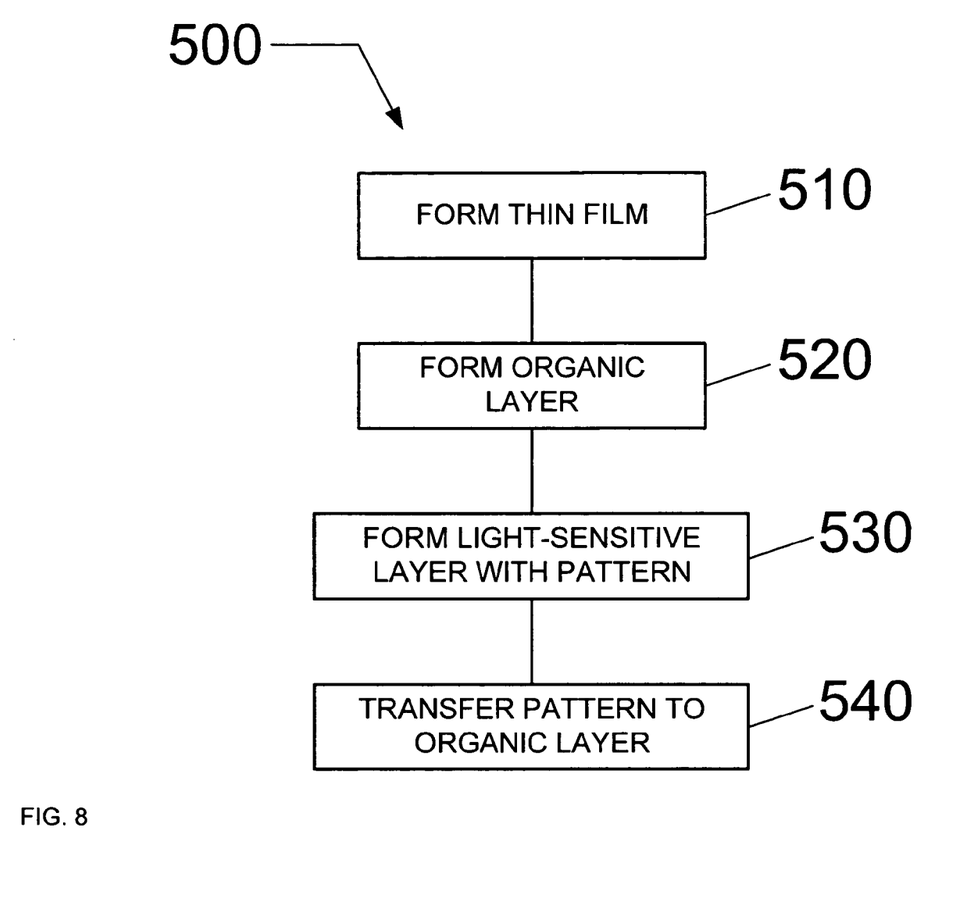
FIG. 8 presents a method of forming a multilayer mask for etching a thin film on a substrate according to another embodiment of the present invention.

FIG. 8 presents a method for forming a multilayer mask for etching a thin film on a substrate in a plasma processing system according to another embodiment of the present invention. The method is illustrated in a flowchart 500 beginning in 510 with forming the thin film on the substrate. The thin film can comprise an oxide layer, such as silicon dioxide ($SiO_2$), and it can be formed by a variety of processes including chemical vapor deposition (CVD).

In 520, an organic layer, such as an organic anti-reflective coating (ARC), is formed on the substrate overlying the thin film. The organic layer can, for example, be an organic ARC layer that is formed using conventional techniques such as a spin coating system.

In 530, a light-sensitive mask layer having a pattern is formed on the substrate overlying the organic layer. The light-sensitive mask layer can comprise, for example, a silicon-containing photoresist layer. The light-sensitive film can be formed using conventional techniques, such as a photoresist spin coating system. The pattern can be formed within the photoresist film by using conventional techniques such as a stepping or scanning micro-lithography system, and a developing solvent.

In 540, the pattern in the light-sensitive layer is transferred to the organic layer in order to form the multilayer mask. The pattern transfer is accomplished using a dry etching technique, wherein the etch process is performed in a plasma processing system that utilizes a process gas comprising one or more gasses collectively containing nitrogen and hydrogen, a first passivation gas including as an incipient ingredient a hydrocarbon, and a second passivation gas including as an incipient ingredient an oxygen containing gas. For example, the process gas can include as incipient ingredient(s) $N_2$ and $H_2$, or ammonia ($NH_3$), or a combination thereof. Additionally, for example, the first passivation gas can include as an incipient ingredient $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or any combination thereof. Furthermore, for example, the second passivation gas can include as an incipient ingredient $O_2$, CO, $CO_2$, NO, $NO_2$, or $N_2O$, or any combination thereof. Alternately, the process gas, as described above, can further comprise helium (He). Plasma is formed in the plasma processing system from the process gas using, for example, any one of the systems described in FIGS. 2 through 6, and the substrate comprising the organic layer is exposed to the plasma formed. A time during which the substrate with the organic layer is exposed to the plasma is generally dictated by the time required to etch the organic layer, or the time required to transfer a photoresist pattern to the organic layer. In general, the time required to transfer a photoresist pattern through the thickness of the organic layer is pre-determined. However, typically, the time is further augmented by a second period of time, or an over-etch time period. As described above, the over-etch time can comprise a fraction of time, such as 1 to 100%, of the first time, and this over-etch period can comprise an extension of etching beyond the detection of endpoint.

Figure 9A:
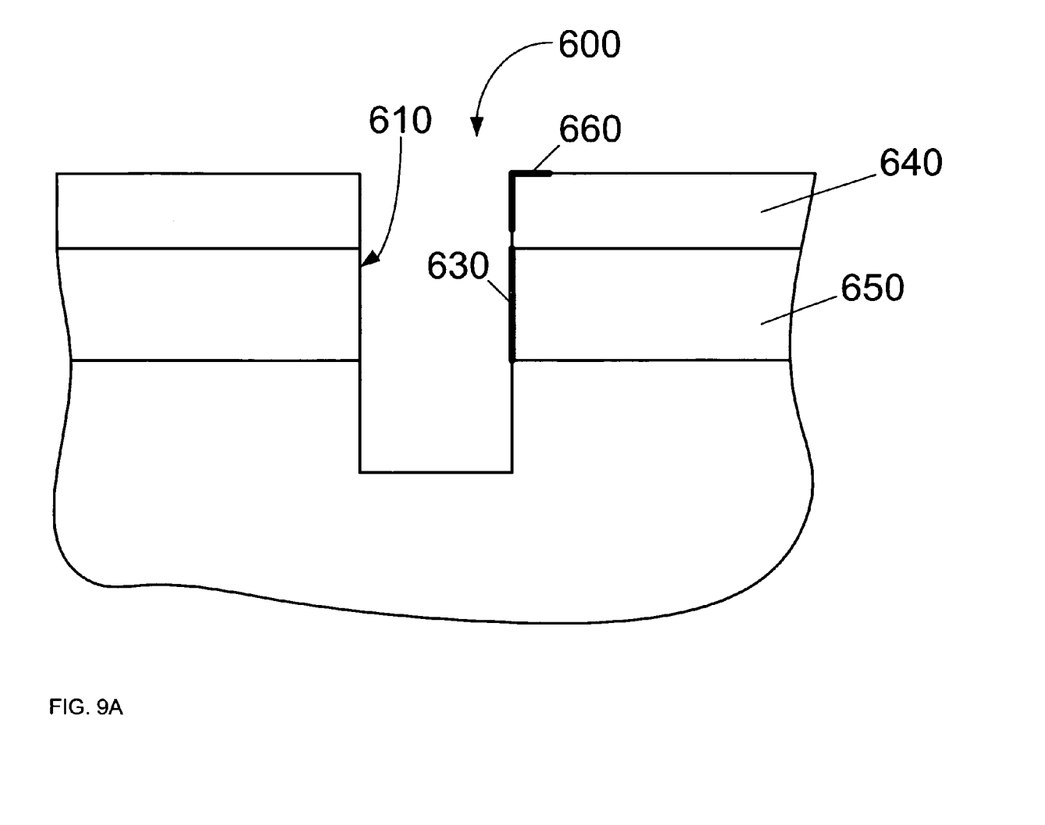
FIGS. 9A and 9B show a schematic representation of a multilayer mask.
Figure 9B:
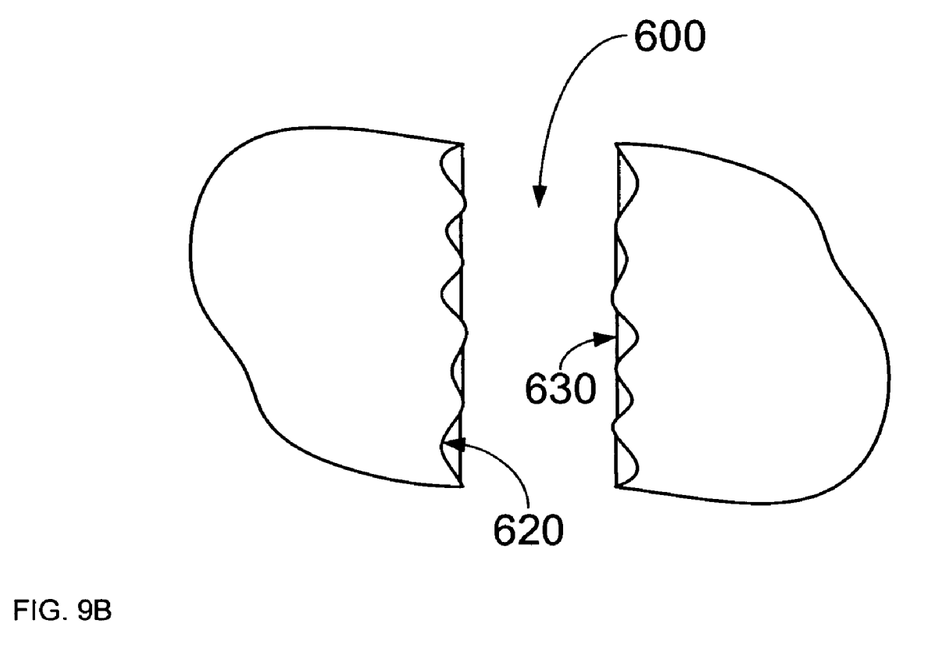

FIGS. 9A and 9B present a side view and a top view of an etched multilayer mask, respectively. Feature 600 comprises sidewalls 610 through light-sensitive layer 640 and organic layer 650 upon which surface roughness 620 can be formed during etching. The first passivation gas facilitates the formation of a passivation film 630 to protect the sidewall of the organic layer 650 during etching while potentially smoothing the surface roughness 620 of the etched multilayer mask; see FIG. 9B. The second passivation gas facilitates the formation of another passivation film 660 on at least a portion of the light-sensitive layer 640 to protect and preserve, for example, the corner of the pattern formed in the light-sensitive layer Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of forming a multilayer mask for etching a material, comprising:
    forming an organic layer on said material;
    forming a light sensitive mask layer on said organic layer, wherein said light sensitive mask layer comprises a silicon-containing light sensitive mask layer;
    forming a pattern in said light sensitive mask layer; and
    transferring said pattern in said light sensitive mask layer to said organic layer by plasma etching said organic layer using a process gas comprising one or more gasses collectively containing nitrogen and hydrogen, said processing gas including a first passivation gas to passivate a sidewall of said organic layer including as an incipient ingredient a hydrocarbon, and said processing gas including a second passivation gas to passivate a sidewall of said light sensitive mask layer including as an incipient ingredient an oxygen containing gas.

2. The method of claim 1, wherein said forming said organic layer comprises forming an organic anti-reflective coating (ARC) layer.

3. The method of claim 1, wherein said forming said pattern in said light sensitive mask layer comprises forming a pattern in said light sensitive layer using micro-lithography.

4. The method of claim 1, wherein said using of said process gas comprises using a process gas including as an incipient ingredient $N_2$ and $H_2$.

5. The method of claim 1, wherein said using of said process gas comprises using a process gas including as incipient ingredients ammonia ($NH_3$).

6. The method of claim 1, wherein said first passivation gas includes as an incipient ingredient $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or any combination of two or more thereof.

7. The method of claim 1, wherein said second passivation gas includes as an incipient ingredient $O_2$, $CO$, $CO_2$, $NO$, $NO_2$, or $N_2O$, or any combination of two or more thereof.

8. The method of claim 1, wherein said process gas further comprises an inert gas.

9. The method of claim 8, wherein said inert gas comprises argon or helium.

10. The method of claim 1 further comprising forming a thin film as said material on a substrate.

* * * * *